(12) United States Patent
Shigematsu

(10) Patent No.: US 6,930,557 B2
(45) Date of Patent: Aug. 16, 2005

(54) MULTI-STAGE AMPLIFIER

(75) Inventor: Hisao Shigematsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/691,549

(22) Filed: Oct. 24, 2003

(65) Prior Publication Data

US 2004/0085133 A1 May 6, 2004

(30) Foreign Application Priority Data

Oct. 24, 2002 (JP) ........................................ 2002-309504

(51) Int. Cl.[7] .............................. H03F 3/68; H03F 3/60
(52) U.S. Cl. .......................... 330/295; 330/286; 330/54
(58) Field of Search ................................ 330/295, 286, 330/54

(56) References Cited

U.S. PATENT DOCUMENTS

| | | | | |
|---|---|---|---|---|
| 5,021,743 A | * | 6/1991 | Chu et al. ..................... | 330/54 |
| 5,227,738 A | * | 7/1993 | Shiga .......................... | 330/307 |
| 5,550,513 A | * | 8/1996 | Wong .......................... | 330/286 |
| 6,472,941 B2 | * | 10/2002 | Shigematsu ................. | 330/286 |

OTHER PUBLICATIONS

"45–GHz distributed amplifier with a linear 6–Vp–p output for a 40–Gb/s LiNbO₃ modulator driver circuit", H. Shigematsu et al., 2001, pp. 137–140.

* cited by examiner

*Primary Examiner*—Patricia Nguyen
(74) *Attorney, Agent, or Firm*—Arent Fox PLLC

(57) ABSTRACT

A multi-stage amplifier includes first and second amplifier stages, and first and second capacitors. The first amplifier stage includes a input line having a first input end and a second input end; an input terminal block connected to the second input end; an amplifier circuit amplifying a first signal input to the first input end; an output line having a first output end where the first signal amplified is output, and a second output end; and an output terminal block connected to the second output end. The second amplifier stage includes components similar to that of the first amplifier stage. The first capacitor is connected between the first output end of the first amplifier stage and the first input end of the second amplifier stage. The second capacitor is connected to any one of the input and output terminal blocks of the first and second amplifier stages.

13 Claims, 10 Drawing Sheets

MULTI-STAGE AMPLIFIER

CROSS-REFERENCE TO RELATED APPLICATIONS

This application is based upon and claims the benefit of priority from the prior Japanese Patent Application No.2002-309504, filed on Oct. 24, 2002, the entire contents of which are incorporated herein by reference.

BACKGROUND OF THE INVENTION

1) Field of the Invention

The present invention relates to a multi-stage amplifier, and more particularly to a high-gain amplifier having a frequency band of more than 40 gigahertz.

2) Description of the Related Art

The rapid spread of the Internet has led to needs for communications systems with high transmission rate (e.g. 40 Gb/s) and high data-capacity. The communications systems require a high-gain amplifier having a frequency band of more than 40 gigahertz in a driver circuit for driving a modulator at a transmitter front end as well as in a preamplifier or an equalizer amplifier at a receiver front end.

Distributed amplifiers have a frequency band determinable from a ladder filter defined by the input capacitance of a transistor and the inductance (L) on a wire. Accordingly, they have been employed in the art as circuitry suitable for broadband applications. Among those, a cascode distributed amplifier includes a circuit which is connected to a common gate (or common base) transistor and exhibits a negative resistance in a high frequency band, and thus can amplify broadband signals. As a result, such a circuit currently becomes the mainstream gradually.

FIG. 1 is a circuit diagram illustrating the configuration of a conventional cascode distributed amplifier. The distributed amplifier includes a plurality of cascode amplifiers, each consisting of a transistor Q1 whose source is grounded and a transistor Q2 whose gate is grounded via a resistor 13 and an input capacitor 14, connected in parallel between an input line 11 and an output line 12. The gate of the transistor Q1 is connected to the input line 11 and the drain to the source of the transistor Q2. The drain of the transistor Q2 is connected to the output line 12.

The input line 11 has one end connected to an input terminal 15 and the other end grounded via a terminal resistor 16. The output line 12 has one end connected to an output terminal 17 and the other end grounded via a terminal resistor 18. In FIG. 1, the rectangular blocks denoted with the reference numerals 19 represent inductance components over the transmission lines, and the arrows (▽) indicate ground (earth) (they are similarly employed in other figures).

The transistor Q1 amplifies a signal input to the input terminal 15. The amplification band depends on the characteristics of a filter defined by the capacitance of the input capacitor 14 and a line inductance component (not shown) on the transistors Q1 and Q2 which are connected in serial. The amplification gain depends on the gain of the transistor Q1. Such amplification allows the transistor Q2 to exhibit a negative resistance in a high frequency band. The negative resistance increases the gain (so-called the gain jump) and accordingly prevents the gain from decreasing in a high frequency band.

The inventor has reported a cascode distributed amplifier with a frequency band of more than 40 gigahertz in "45-GHz distributed amplifier with a linear 6-Vp-p output for a 40 Gb/s LiNb 03 modulator driver circuit", 2001 IEEE GaAs Digest, pp. 137, 2001 (hereinafter, "inventor's report").

In general, however, the cascode distributed amplifier has a low gain. One approach to increase the gain is to connect plural amplifier stages, each including the cascode distributed amplifiers, in cascade. In this amplifier stages, if a pre-amplifier stage is direct current (hereinafter, "DC") coupled to a post-amplifier stage, since each stage has a different bias level from another, it is difficult to determine the gain definitely. However, if the pre-amplifier stage is coupled to the post-amplifier stage via a DC cut capacitor, the gain can be determined definitely.

The capacitive coupling between stages requires a very large capacitor. This capacitor has an inductance component, which influences on the gain to be decreased in a high frequency range disadvantageously. In addition, both the distributed amplifier and the capacitor cannot be integrated on a single semiconductor substrate. Accordingly, it is necessary to connect the distributed amplifier integrated on a semiconductor substrate, to a capacitor externally located, by wiring. This arrangement causes the gain to be decreased in a high frequency range disadvantageously.

SUMMARY OF THE INVENTION

It is an object of the present invention to at least solve the problems in the conventional technology.

A multi-stage amplifier according to the present invention includes a first amplifier stage, a second amplifier stage, a first capacitor, and a second capacitor. The first amplifier stage includes a first input line having a first input end where a first signal is input and a second input end; a first input terminal block connected to the second input end; a first amplifier circuit amplifying the first signal; a first output line having a first output end where the first signal amplified is output and a second output end; and a first output terminal block connected to the second output end. The second amplifier stage includes a second input line having a third input end where a second signal is input, and a fourth input end; a second input terminal block connected to the fourth input end; a second amplifier circuit amplifying the second signal; a second output line having a third output end where the second signal amplified is output and a fourth output end; and a second output terminal block connected to the fourth output end. The first capacitor is connected between the first output end and the third input end. The second capacitor is connected to any one of the first input terminal block, the first output terminal block, the second input terminal block, and the second output terminal block.

The other objects, features and advantages of the present invention are specifically set forth in or will become apparent from the following detailed descriptions of the invention when read in conjunction with the accompanying drawings.

DETAILED DESCRIPTION

Exemplary embodiments of a multi-stage amplifier relating to the present invention will be explained in detail below with reference to the accompanying drawings.

Figure 2:
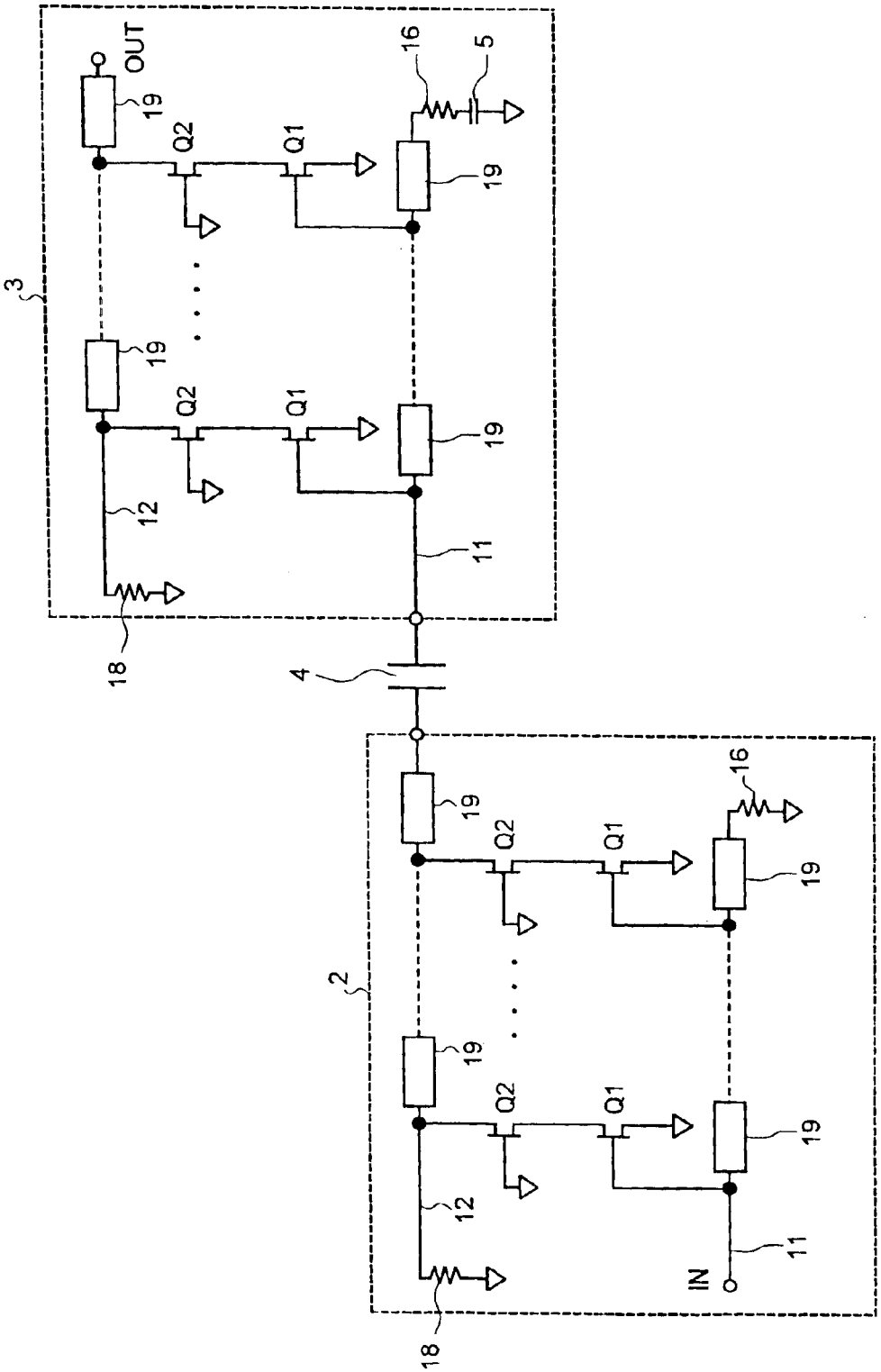
FIG. 2 is a circuit diagram of a multi-stage amplifier according to a first embodiment of the present invention.

FIG. 2 is a circuit diagram illustrating the configuration of a multi-stage amplifier according to a first embodiment of the present invention. This multi-stage amplifier is configured to connect a pre-amplifier stage 2 to a post-amplifier stage 3 in cascade via a first capacitor (DC cut capacitor) 4. The output line 12 in the pre-amplifier stage 2 is coupled to the input line 11 in the post-amplifier stage 3 via the first capacitor 4. A second capacitor 5 is connected between the terminal resistor 16 on the input line 11 in the post-amplifier stage 3 and the ground point. In addition, as shown in FIG. 3, a resistor 6 may be connected in parallel with the first capacitor 4.

Figure 1:
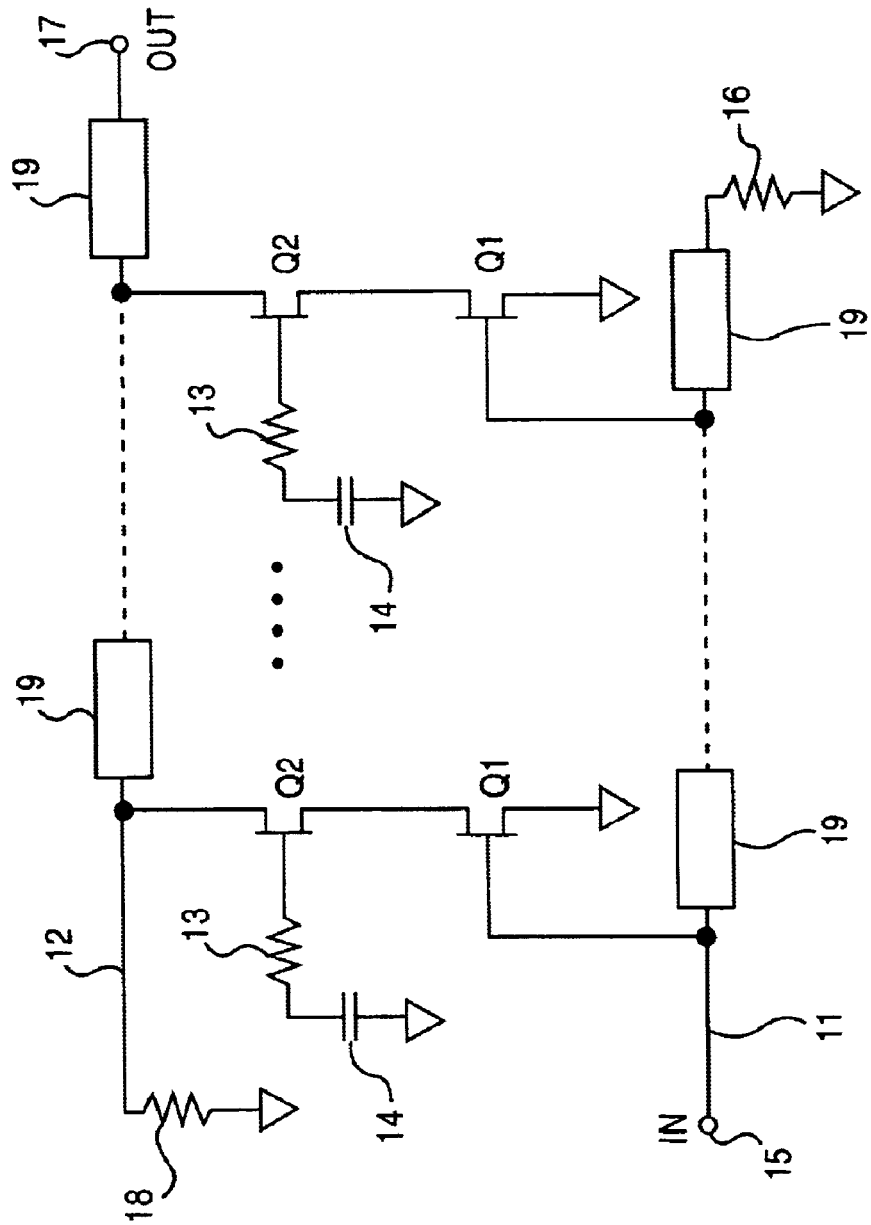
FIG. 1 is a circuit diagram of a conventional distributed amplifier.

The pre-amplifier stage 2 and the post-amplifier stage 3 both include the cascode-type single-phase distributed amplifiers with the same conventional configuration as illustrated in FIG. 1. For the purpose of simplification, the resistor 13 and the input capacitor 14 connected to the gate of the transistor Q2 are omitted in FIGS. 2 and 3 (and also in FIG. 6 to FIG. 8). The first capacitor 4, the second capacitor 5 and the resistor 6 are formed on the same semiconductor substrate together with the cascode type distributed amplifiers for use in the pre-amplifier stage 2 and the post-amplifier stage 3. In other words, the multi-stage amplifier of the first embodiment can be achieved on a single semiconductor chip.

Figure 3:
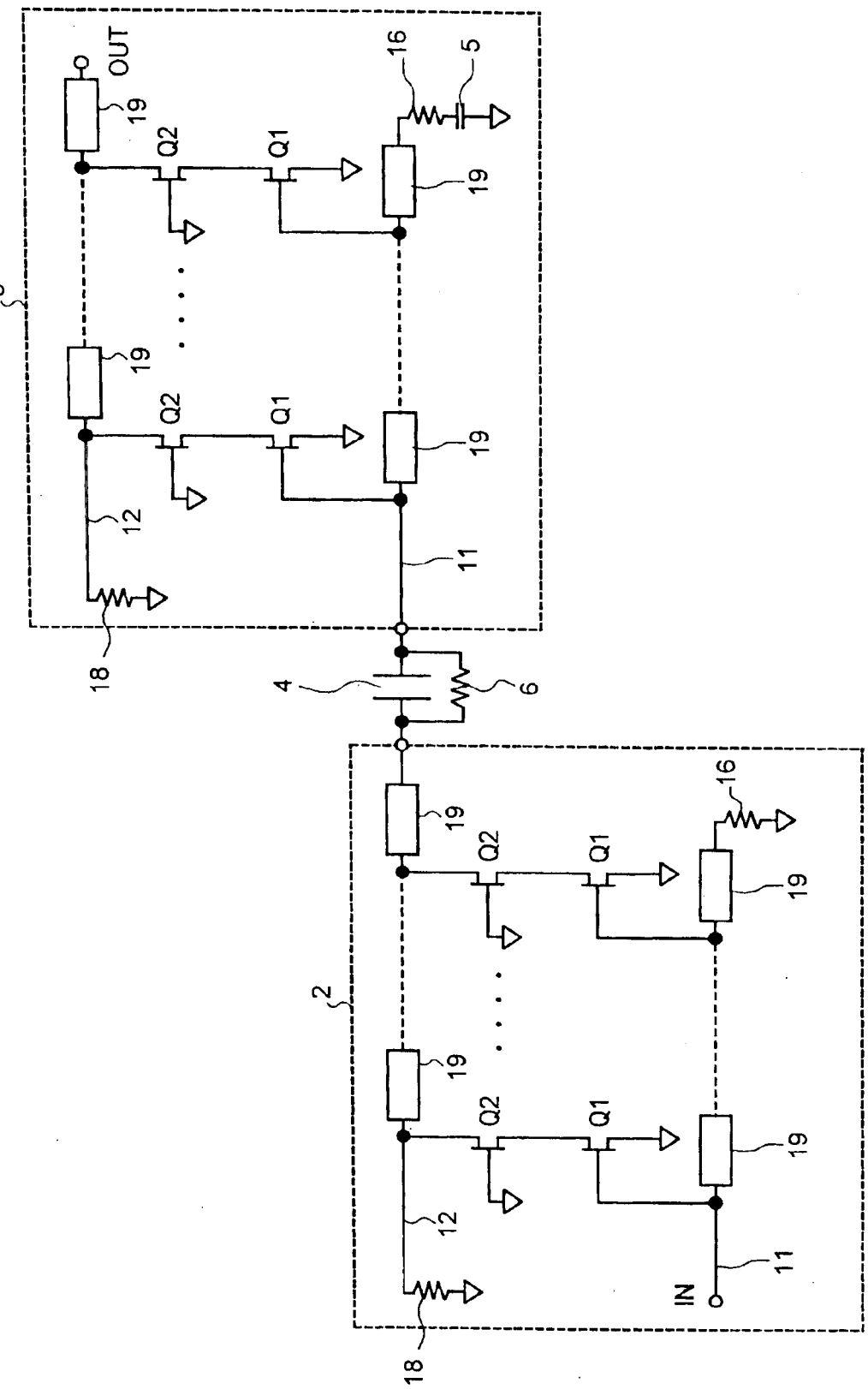
FIG. 3 is a circuit diagram illustrating a modification of the multi-stage amplifier according to the first embodiment.
Figure 4:
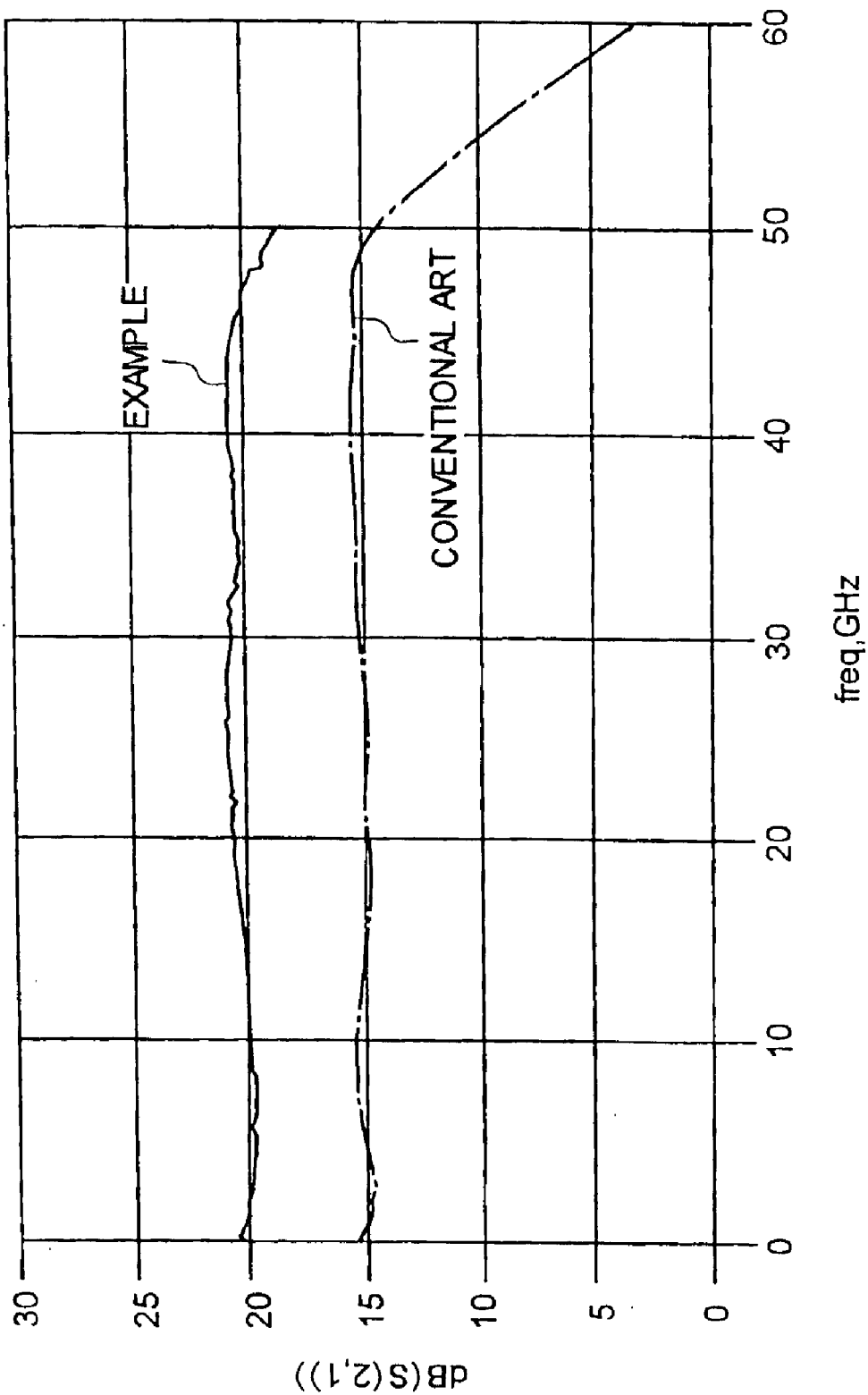
FIG. 4 illustrates a gain-frequency characteristic after the multi-stage amplifier according to the first embodiment is optimized.
Figure 5:
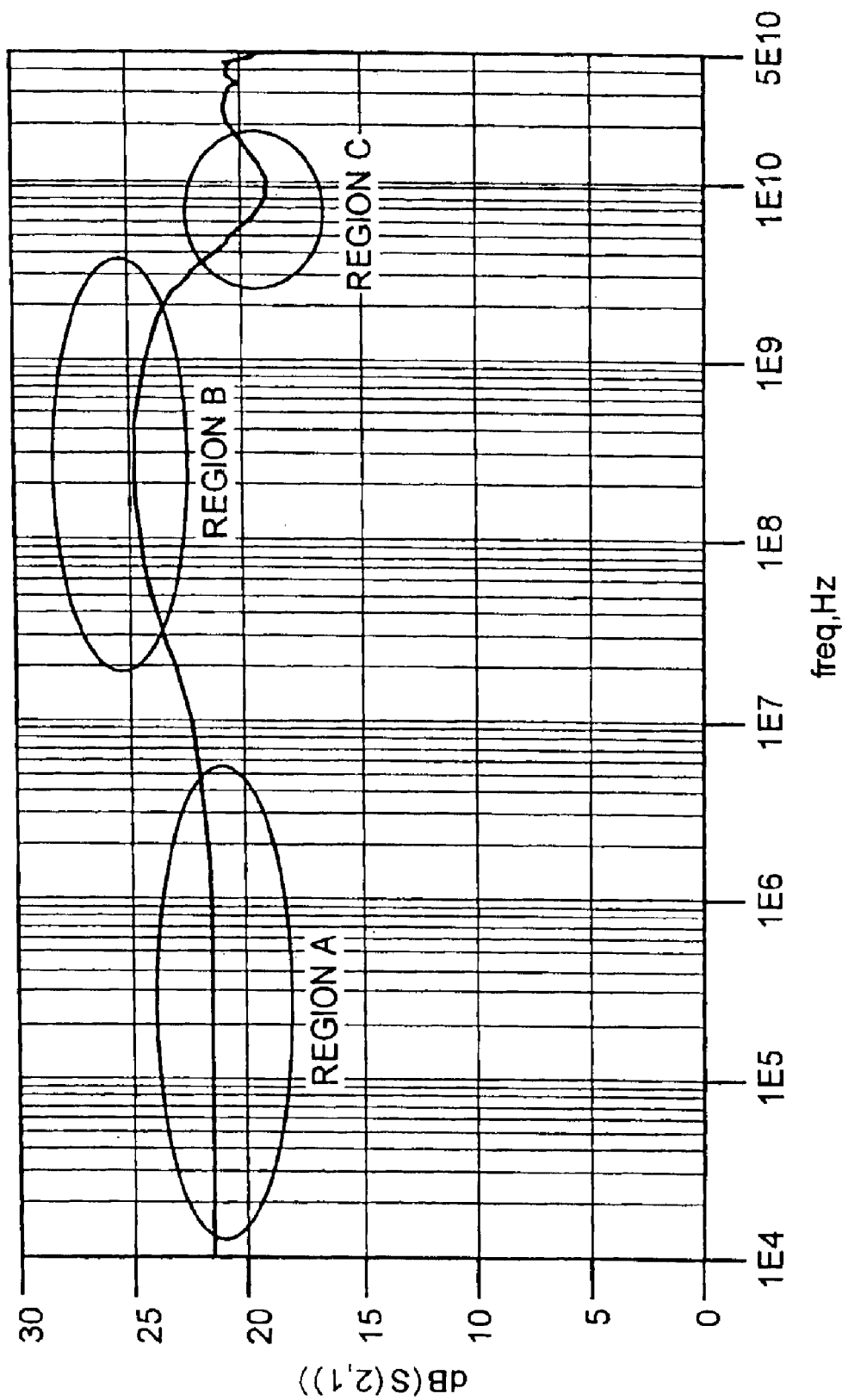
FIG. 5 illustrates a gain-frequency characteristic before the multi-stage amplifier according to the first embodiment is optimized.

An example of the multi-stage amplifier with the configuration illustrated in FIG. 3 is fabricated using a GaAs semiconductor material. This multi-stage amplifier has gain-frequency characteristics, which are illustrated in FIGS. 4 and 5. FIG. 4 is a gain-frequency characteristic after the first capacitor 4, the second capacitor 5, and the resistor 6 are adjusted appropriately. FIG. 5 is a gain-frequency characteristic before they are adjusted. It is found from FIG. 4 that a gain of approximately 20 decibels can be achieved over the whole 0 to 50 gigahertz band. This is effective to configure a multi-stage amplifier with a 20 decibel gain and 50 gigahertz band using GaAs high electron mobility transistors (HEMTs).

As illustrated in FIG. 5, the gain flatness is low before the first capacitor 4, the second capacitor 5, and the resistor 6 are adjusted. To achieve a frequency characteristic with an improved gain flatness as illustrated in FIG. 4, for a frequency zone of approximately $10^4$ to $6\times10^6$ hertz shown as "Region A" in FIG. 5, the resistor 6 connected in parallel with the first capacitor 4 is adjusted. In addition, for a frequency zone of approximately $10^7$ to $4\times10^9$ hertz or "Region B", the first capacitor 4 is adjusted. Finally, for a frequency zone of approximately $2\times10^9$ to $2\times10^{10}$ hertz or "Region C", the second capacitor 5 is adjusted. A much finer adjustment can be achieved when an additional resistor is connected in parallel with the second capacitor 5.

FIG. 4 also illustrates a gain-frequency characteristic of the distributed amplifier disclosed in the inventor's report. In the conventional distributed amplifier, a gain of approximately 15 decibels is achieved at most over the whole 0 to 50 gigahertz band.

Figure 6:
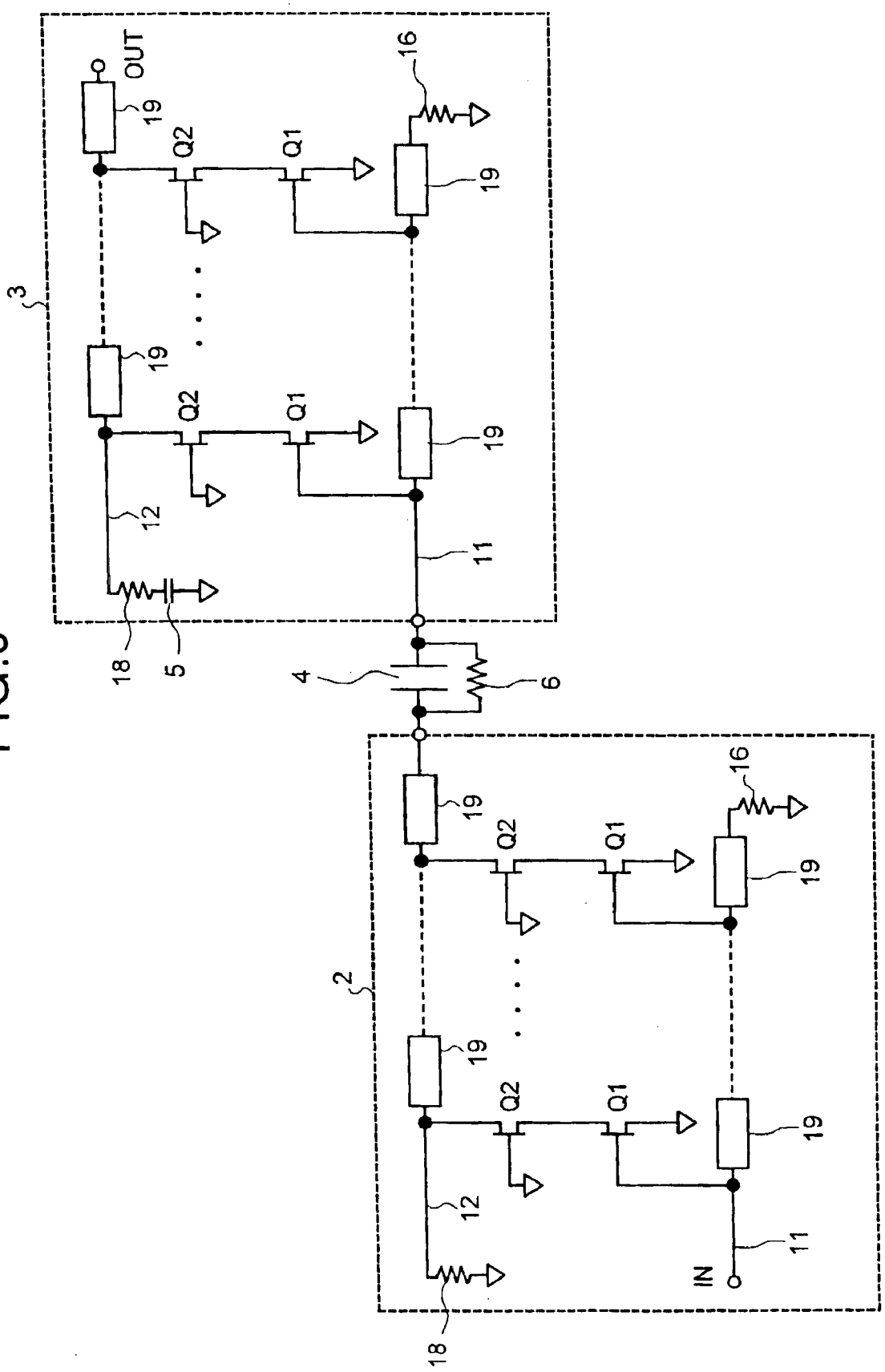
FIG. 6 is a circuit diagram of a multi-stage amplifier according to a second embodiment of the present invention.

FIG. 6 is a circuit diagram illustrating the configuration of a multi-stage amplifier according to a second embodiment of the present invention. The multi-stage amplifier of the second embodiment is configured to change the second capacitor 5 in the first embodiment illustrated in FIG. 3 to be connected between the terminal resistor 18 on the output line 12 in the post-amplifier stage 3 and the ground point. The rest of the structure is the same or similar to that in the first embodiment. When the first capacitor 4, the second capacitor 5, and the resistor 6 are adjusted appropriately, a gain of approximately 20 decibels can be achieved over the whole 0 to 50 gigahertz band similar to the first embodiment.

Figure 7:
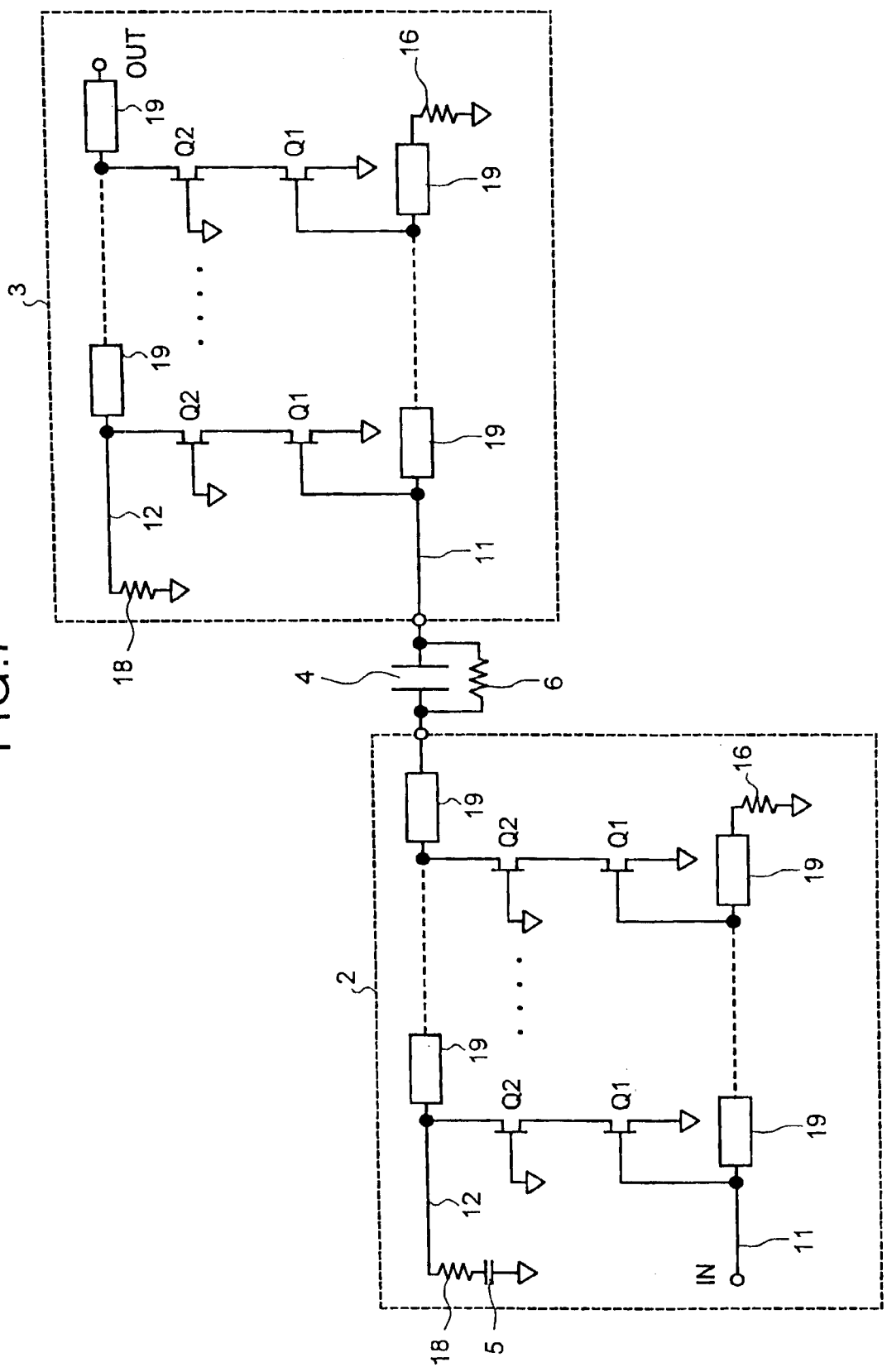
FIG. 7 is a circuit diagram of a multi-stage amplifier according to a third embodiment of the present invention.

FIG. 7 is a circuit diagram illustrating the configuration of a multi-stage amplifier according to a third embodiment of the present invention. The amplifier of the third embodiment is configured to change the second capacitor 5 in the first embodiment illustrated in FIG. 3 to be connected between the terminal resistor 18 on the output line 12 in the pre-amplifier stage 2 and the ground point. The rest of the structure is the same or similar to that in the first embodiment. When the first capacitor 4, the second capacitor 5, and the resistor 6 are adjusted appropriately, a gain of approximately 20 decibels can be achieved over the whole 0 to 50 gigahertz band similar to the first embodiment.

Figure 8:
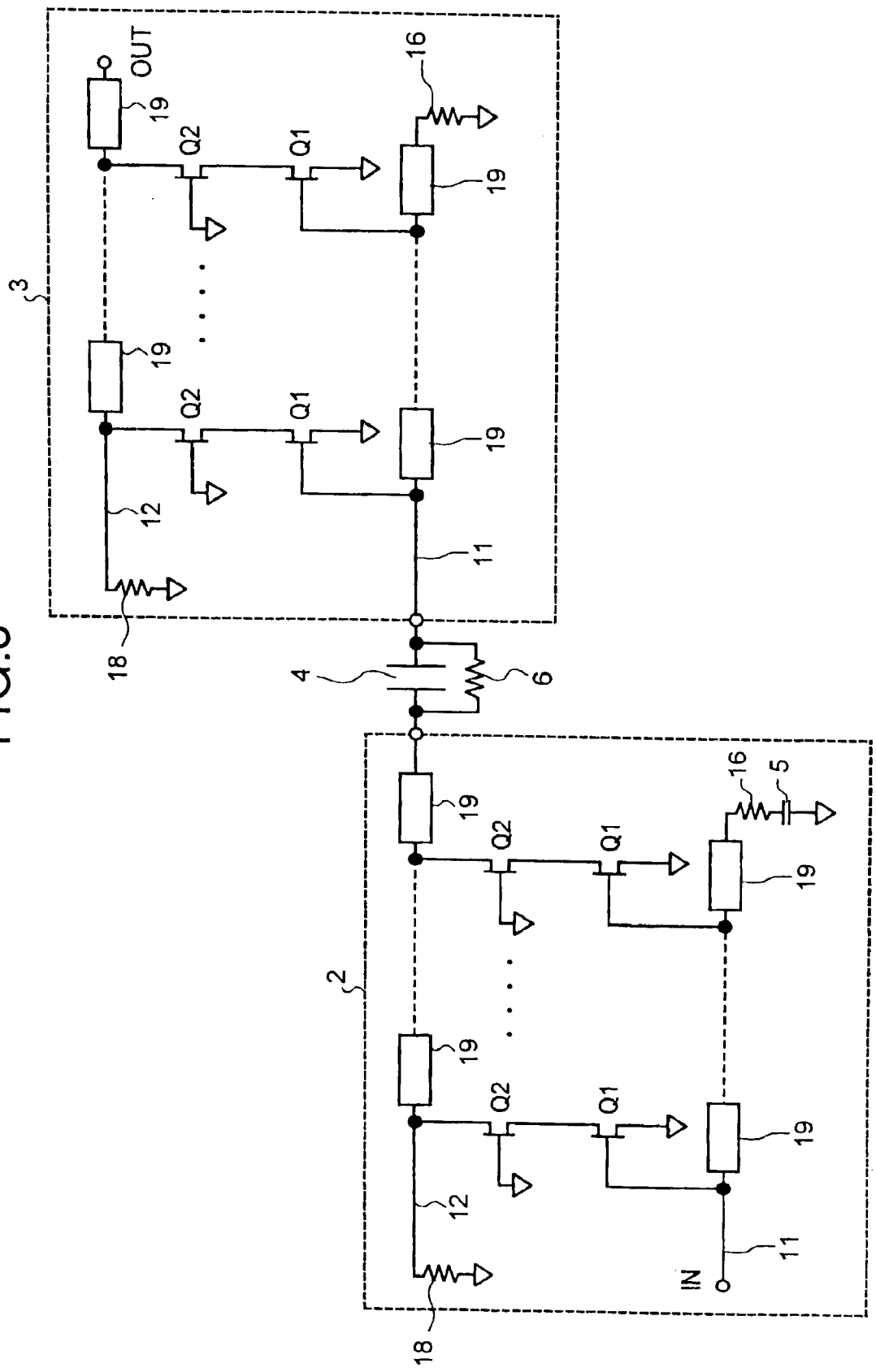
FIG. 8 is a circuit diagram of a multi-stage amplifier according to a fourth embodiment of the present invention.

FIG. 8 is a circuit diagram illustrating the configuration of a multi-stage amplifier according to a fourth embodiment of the present invention. The amplifier of the fourth embodiment is configured to change the second capacitor 5 in the first embodiment illustrated in FIG. 3 to be connected between the terminal resistor 16 on the input line 11 in the pre-amplifier stage 2 and the ground point. The rest of the structure is the same or similar to that in the first embodiment. When the first capacitor 4, the second capacitor 5, and the resistor 6 are adjusted appropriately, a gain of approximately 20 decibels can be achieved over the whole 0 to 50 gigahertz band similar to the first embodiment.

Figure 9:
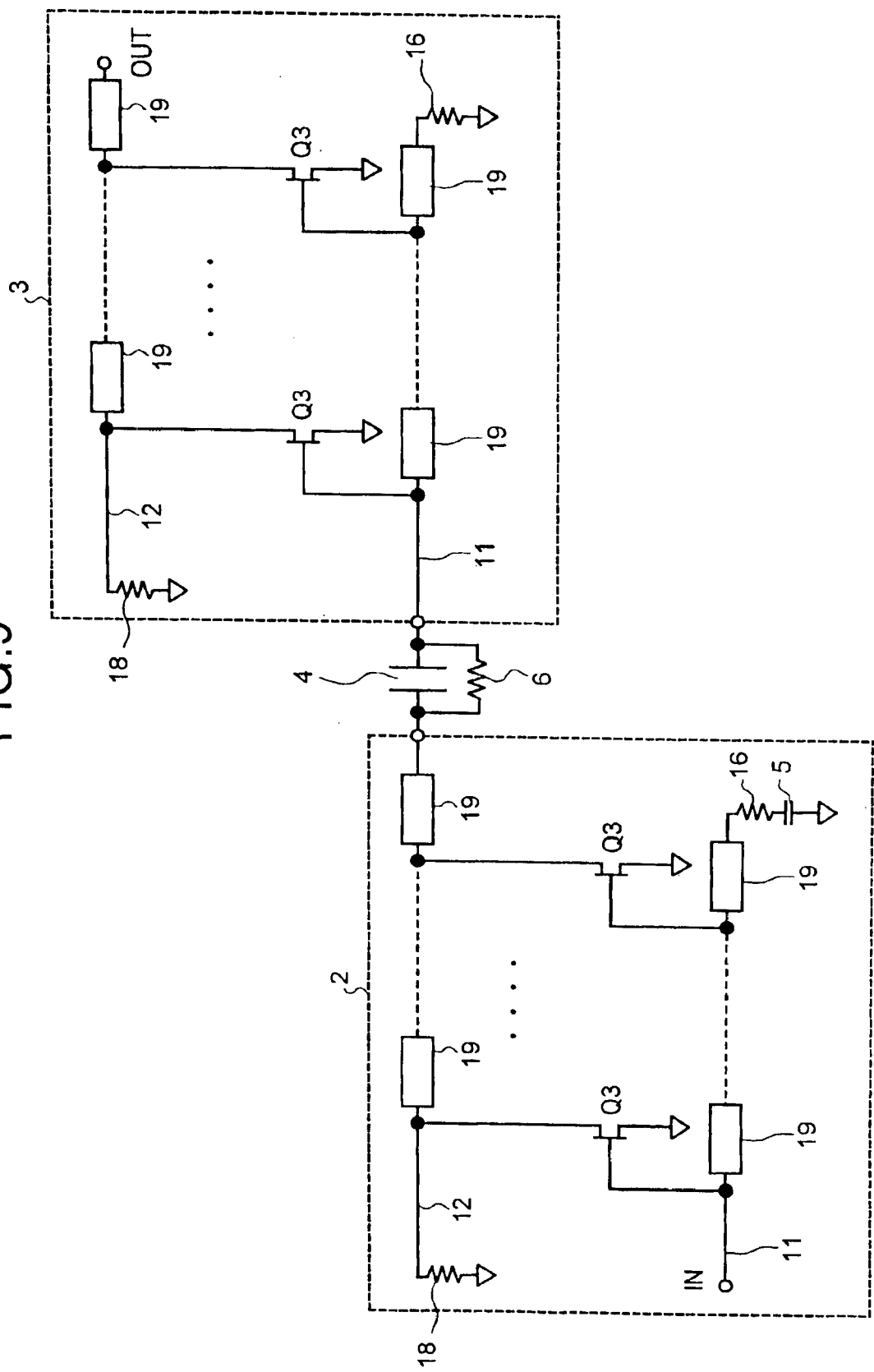
FIG. 9 is a circuit diagram of a multi-stage amplifier according to a fifth embodiment of the present invention.

FIG. 9 is a circuit diagram illustrating the configuration of a multi-stage amplifier according to a fifth embodiment of the present invention. The amplifier of the fifth embodiment is configured to change the pre-amplifier stage 2 and the post-amplifier stage 3 in the fourth embodiment illustrated in FIG. 8 to include, instead of the cascode distributed amplifiers, general distributed amplifiers, each of which includes plural transistors Q3 connected in parallel between the input line 11 and the output line 12. The transistor Q3 has a gate connected to the input line 11, a source grounded, and a drain connected to the output line 12.

The rest of the structure is the same or similar to that in the fourth embodiment. The second capacitor 5 may be connected between the terminal resistor 16 on the input line 11 in the post-amplifier stage 3 and the ground point; between the terminal resistor 18 on the output line 12 in the post-amplifier stage 3 and the ground point; or between the terminal resistor 18 on the output line 12 in the pre-amplifier stage 2 and the ground point, as is in the first to the third embodiments.

Figure 10:
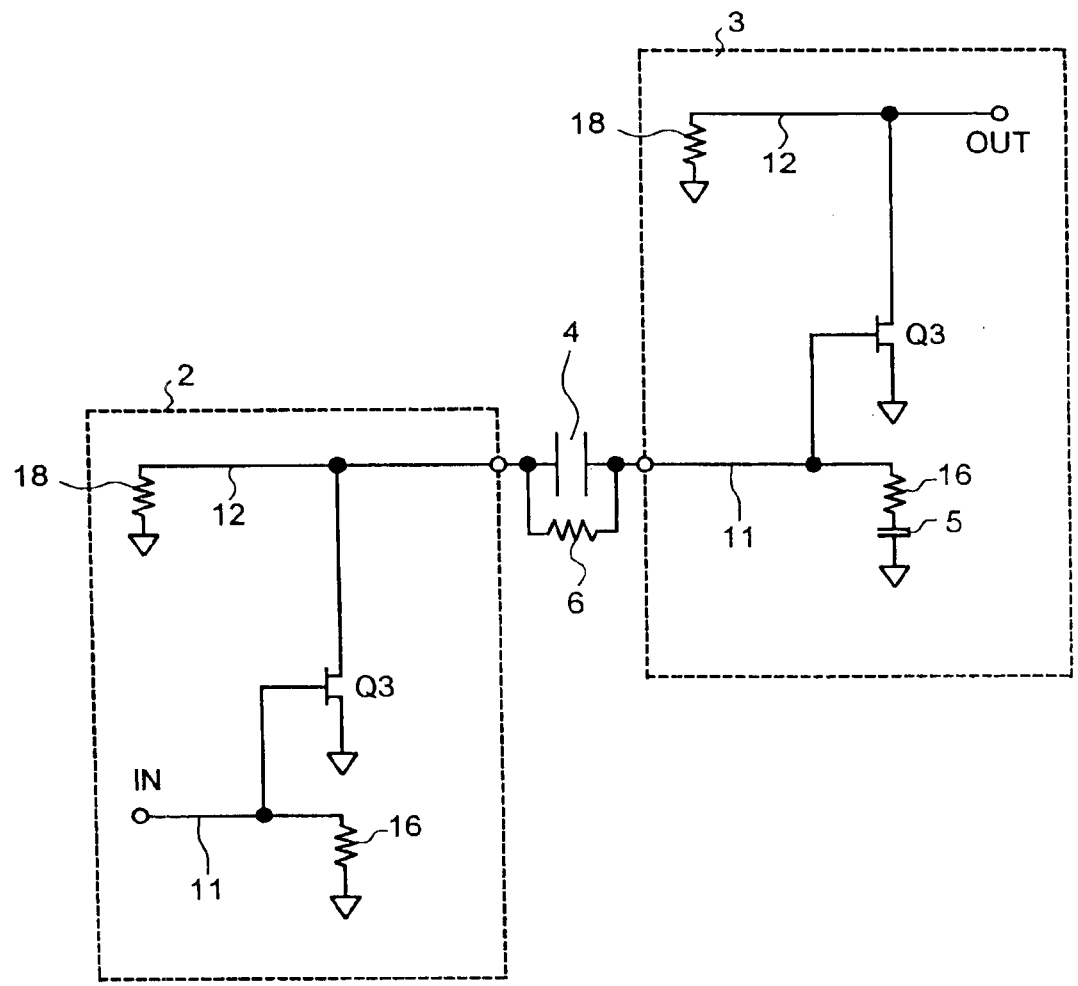
FIG. 10 is a circuit diagram of a multi-stage amplifier according to a sixth embodiment of the present invention.

FIG. 10 is a circuit diagram illustrating the configuration of a multi-stage amplifier according to a sixth embodiment of the present invention. The amplifier of the sixth embodiment is configured to change the pre-amplifier stage 2 and the post-amplifier stage 3 in the first embodiment illustrated in FIG. 3 to include, instead of the cascode distributed amplifiers, general lumped amplifiers, each of which includes a transistor Q3 connected between the input line 11 and the output line 12. The transistor Q3 has a gate connected to the input line 11, a source grounded, and a drain connected to the output line 12.

The rest of the structure is the same or similar to that in the first embodiment. The second capacitor 5 may be connected between the terminal resistor 18 on the output line 12 in the post-amplifier stage 3 and the ground point; between the terminal resistor 18 on the output line 12 in the pre-amplifier stage 2 and the ground point; or between the terminal resistor 16 on the input line 11 in the pre-amplifier stage 2 and the ground point, as is in the second to the fourth embodiments.

According to the above-described embodiments, the first capacitor 4 can be integrated on a single semiconductor chip together with the pre-amplifier stage 2, the post-amplifier stage 3, the second capacitor 5 and the resistor 6, removing the need for external connection of the DC cut capacitor. In addition, the reduced first capacitor 4 can prevent the gain from decreasing at a high frequency region. The serial connection of the second capacitor 5 to the terminal resistors 16, 18 increases the terminal resistance at a low frequency region and elevates the gain at the low frequency region. This is effective to compensate for the decreased gain at the low frequency region due to the capacitive coupling. Therefore, amplifiers with high-gain and flat frequency characteristics over a broadband, in particular the distributed amplifiers according to the first to the fifth embodiments, can be achieved on one chip. The use of these amplifiers can accurately amplify a 40 Gb/s signal or an optical communication input that contains various frequency components. The capacitive coupling of the pre-amplifier stage 2 to the post-amplifier stage 3 can absorb variations in threshold in multi-stage amplifiers. Appropriate adjustment of the first capacitor 4, the second capacitor 5, and the resistor 6 can adjust an amount of the gain jump.

The present invention is not limited in the first to the sixth embodiments, but rather can be modified variously. For example, as the transistors used to configure the pre-amplifier stage 2 and the post-amplifier stage 3, bipolar transistors may be employed instead of the field effect transistors. Semiconductor materials other than GaAs semiconductor, such as InP, Si and GaN, may be employed to achieve the same effect. The number of amplifier stages connected in cascade may be equal to three or more. In this case, the second capacitor may be connected in serial to the terminal resistor on the input line or the output line in either of the amplifier stages. The resistor 6 may not be connected in parallel with the first capacitor 4 depending on the case.

According to the present invention, the first capacitor is integrated on the semiconductor chip on which the pre-amplifier stage and the post-amplifier stage are fabricated. Therefore, it is not required to externally connect any DC cut capacitor to the semiconductor chip. This is effective to prevent the gain from decreasing at a high frequency range. The first capacitor has a size in a degree enough to be fabricated on the same semiconductor substrate together with the pre-amplifier stage and the post-amplifier stage. This is effective to prevent the gain from decreasing at a high frequency region. The second capacitor connected in serial to the terminal resistor increases the terminal resistance at a low frequency region and elevates the gain at the low frequency region. This is effective to compensate for the reduced gain due to the capacitive coupling at the low frequency region. Therefore, an amplifier with a high-gain and flat frequency characteristic over a broad band can be achieved in one chip.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A multi-stage amplifier comprising:
   a first amplifier stage that includes
      a first input line having a first input end and a second input end, wherein a first signal is input to the first input end;
      a first input terminal block connected to the second input end;
      a first amplifier circuit amplifying the first signal;
      a first output line having a first output end and a second output end, wherein the first signal amplified is output from the first output end; and
      a first output terminal block connected to the second output end;
   a second amplifier stage that includes
      a second input line having a third input end and a fourth input end, wherein a second signal is input to the third input end;
      a second input terminal block connected to the fourth input end;
      a second amplifier circuit amplifying the second signal;
      a second output line having a third output end and a fourth output end, wherein the second signal amplified is output from the third output end; and
      a second output terminal block connected to the fourth output end;
   a first capacitor connected between the first output end and the third input end; and
   a second capacitor connected to any one of the first input terminal block, the first output terminal block, the second input terminal block, and the second output terminal block.

2. The multi-stage amplifier according to claim 1, wherein the second input terminal block includes a resistor, and the second capacitor is connected between the resistor and a ground line.

3. The multi-stage amplifier according to claim 1, wherein the second output terminal block includes a resistor, and the second capacitor is connected between the resistor and a ground line.

4. The multi-stage amplifier according to claim 1, wherein the first output terminal block includes a resistor, and the second capacitor is connected between the resistor and a ground line.

5. The multi-stage amplifier according to claim 1, wherein the first input terminal block includes a resistor, and the second capacitor is connected between the resistor and a ground line.

6. The multi-stage amplifier according to claim 1, wherein each of the first and second amplifier stages is a distributed-circuit.

7. The multi-stage amplifier according to claim 6, wherein each of the first and second amplifier circuits includes a plurality of cascode amplifiers connected in parallel between the input line and the output line.

8. The multi-stage amplifier according to claim 1, wherein each of the first and second amplifier stages is a lumped-circuit.

9. The multi-stage amplifier according to claim 1, further comprising a resistor connected in parallel with the first capacitor.

10. The multi-stage amplifier according to claim 9, wherein the first amplifier stage, the second amplifier stage, the first capacitor, the second capacitor, and the resistor are integrated on a single semiconductor substrate.

11. The multi-stage amplifier according to claim 1, wherein the first amplifier stage, the second amplifier stage, and the first capacitor, the second capacitor are integrated on a single semiconductor substrate.

12. The multi-stage amplifier according to claim 1, wherein each of the first and second amplifier stages is a field effect transistor circuit.

13. The multi-stage amplifier according to claim 1, wherein each of the first and second amplifier stages is a bipolar transistor circuit.

* * * * *